United States Patent
Takahashi

(10) Patent No.: US 10,381,947 B2
(45) Date of Patent: Aug. 13, 2019

(54) POWER CONVERSION APPARATUS

(71) Applicant: FUJI ELECTRIC CO., LTD., Kawasaki-shi, Kanagawa (JP)

(72) Inventor: Kiyoshi Takahashi, Sagamihara (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 38 days.

(21) Appl. No.: 15/422,448

(22) Filed: Feb. 1, 2017

(65) Prior Publication Data

US 2017/0272002 A1 Sep. 21, 2017

(30) Foreign Application Priority Data

Mar. 16, 2016 (JP) .................. 2016-051938

(51) Int. Cl.
| | |
|---|---|
| *H02M 7/217* | (2006.01) |
| *H01L 27/06* | (2006.01) |
| *H01L 29/16* | (2006.01) |
| *H01L 29/872* | (2006.01) |
| *H01R 12/52* | (2011.01) |
| *H02M 1/08* | (2006.01) |
| *H02M 7/00* | (2006.01) |
| *H05K 7/14* | (2006.01) |

(52) U.S. Cl.
CPC ........ *H02M 7/217* (2013.01); *H01L 27/0629* (2013.01); *H01L 29/1608* (2013.01); *H01L 29/872* (2013.01); *H01R 12/52* (2013.01); *H02M 1/08* (2013.01); *H02M 7/003* (2013.01); *H05K 7/1427* (2013.01); *H05K 7/1432* (2013.01)

(58) Field of Classification Search
CPC ........ H02M 1/08; H02M 1/084; H02M 1/088; H02M 1/092; H02M 1/096; H02M 7/003; H02M 7/217; H02M 7/1432; H02M 7/1427; H01L 27/0629; H01L 29/1608; H01L 29/872; H01R 1/08
USPC .................. 363/147; 361/600; 327/108–112
See application file for complete search history.

(56) References Cited

U.S. PATENT DOCUMENTS

| | | | |
|---|---|---|---|
| 9,190,206 B1* | 11/2015 | Luzanov | H05K 1/141 |
| 2003/0002311 A1* | 1/2003 | Mori | H02M 7/003 |
| | | | 363/147 |
| 2010/0025126 A1* | 2/2010 | Nakatsu | B60L 11/00 |
| | | | 180/65.1 |

(Continued)

FOREIGN PATENT DOCUMENTS

JP 2015-198545 A 11/2015

*Primary Examiner* — Nguyen Tran
*Assistant Examiner* — Bryan R Perez
(74) *Attorney, Agent, or Firm* — Rabin & Berdo, P.C.

(57) ABSTRACT

A power conversion apparatus includes: a power module that converts an input of alternating current power into direct current (DC) power and outputs the DC power; and a gate driver unit that includes a first substrate having mounted thereon a gate driver circuit component that isolates a control signal input from a control apparatus, that converts the isolated control signal into a gate signal for driving the power module, and that outputs the gate signal, a second substrate that includes a wiring conductor fixed to a gate control terminal of the power module, and a connection member that includes a connector that connects the first substrate and the second substrate to each other.

11 Claims, 8 Drawing Sheets

(56) References Cited

U.S. PATENT DOCUMENTS

| | | | |
|---|---|---|---|
| 2012/0200171 A1* | 8/2012 | Sato | H02J 9/062 |
| | | | 307/113 |
| 2012/0262951 A1* | 10/2012 | Suenaga | H05B 6/666 |
| | | | 363/16 |
| 2016/0005883 A1* | 1/2016 | Yen | H01L 29/8083 |
| | | | 257/77 |

* cited by examiner

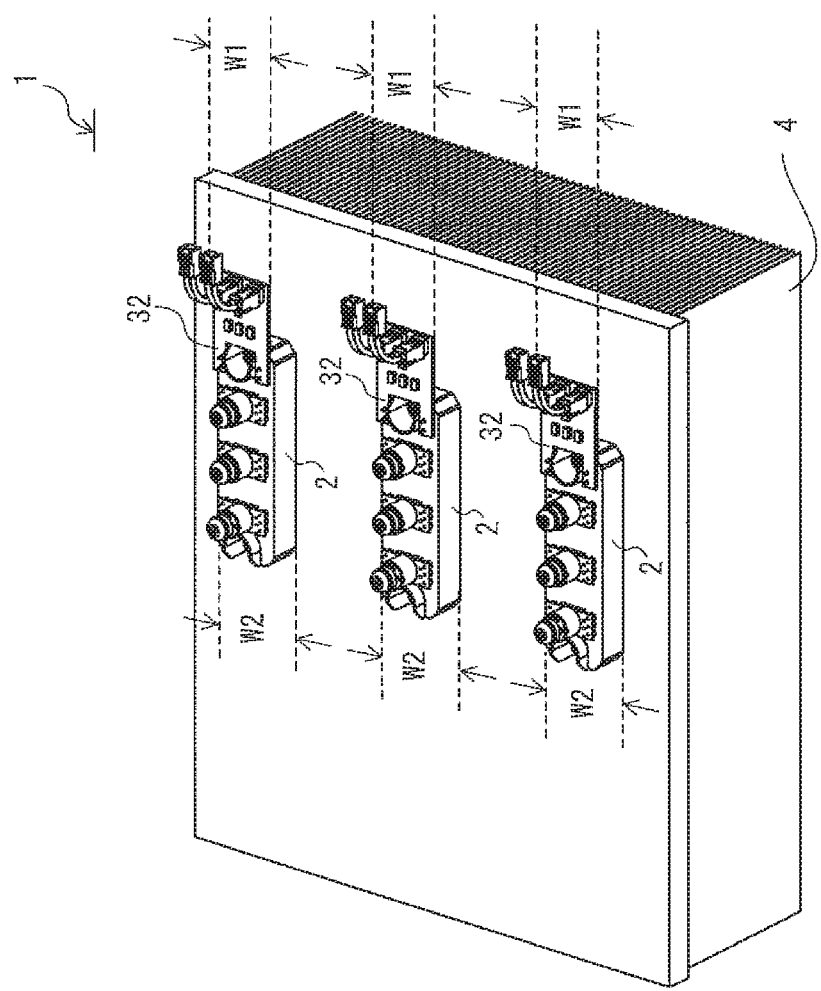
F I G. 6

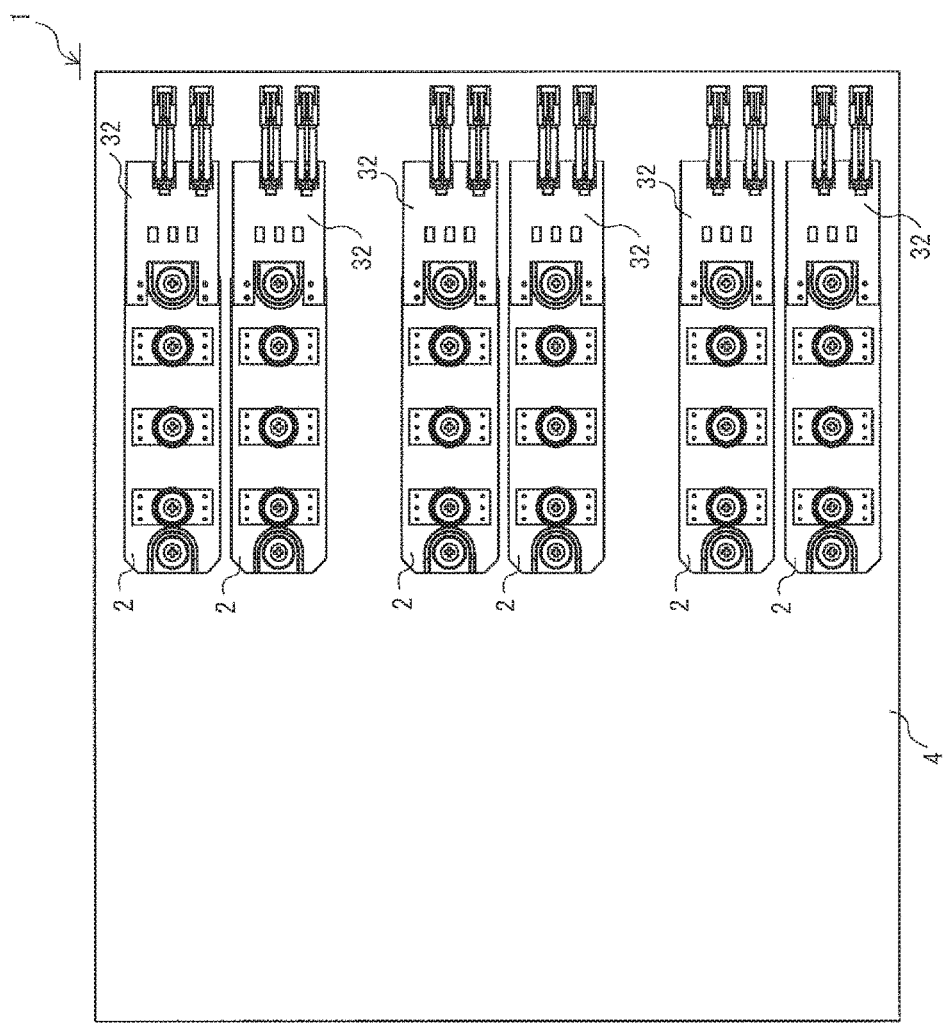
F I G. 7

POWER CONVERSION APPARATUS

CROSS-REFERENCE TO RELATED APPLICATION

This application is based upon and claims the benefit of priority of the prior Japanese Patent Application No. 2016-051938, filed on Mar. 16, 2016, the entire contents of which are incorporated herein by reference.

BACKGROUND OF THE INVENTION

Technical Field

The present invention relates to a power conversion apparatus.

Background Art

A power conversion apparatus that converts input AC (Alternating Current) power into DC (Direct Current) power and that outputs the DC power includes a gate driver unit and a power module.

The gate driver unit (GDU) includes a gate substrate. The gate substrate has mounted thereon a gate driver circuit component for isolating a control signal input from a control apparatus outside the power conversion apparatus, for converting the isolated control signal into a gate signal, and for outputting the gate signal.

The power module includes, for example, a switching element and a freewheeling diode connected in inverse-parallel to the switching element. The switching element is turned on or off in accordance with a gate signal input from the gate driver unit via a gate control line. The freewheeling diode causes a current generated upon turning on the switching element to detour around the switching element so as to prevent a failure of the switching element.

The gate driver circuit component includes a gate resistor. The gate resistor is connected to a gate control line between the gate driver unit and the switching element. The gate resistor suppresses a surge voltage generated upon turning off the switching element or noise generated upon switching so as to stabilize a gate signal input to the switching element.

Recently, wide bandgap semiconductors have been sometimes used for switching elements in power modules. An exemplary wide bandgap semiconductor is a SiC (silicon carbide)-MOSFET (Metal-Oxide-Semiconductor Field-Effect Transistor). In comparison with a Si (Silicon)-based switching element such as a Si-IGBT (Insulated Gate Bipolar Transistor), a wide bandgap semiconductor may have pressure resistance and achieve fast switching. To enable fast switching of a switching element comprising such a wide bandgap semiconductor, a gate resistor needs to be operated effectively. Hence, the gate electrode is desirably located near the switching element.

A gate driver unit described in Japanese Laid-open Patent Publication No. 2015-198545 includes a first substrate (gate substrate) and a second substrate (gate relay substrate) that is fixed to a gate terminal of a power module by soldering or the like. A gate resistor is mounted on the second substrate. The second substrate is connected to the first substrate by a gate control line. The gate control line is fixed to the first and second substrates by soldering or the like. A well-known example of the gate control line is a wiring conductor plate wherein a gate wire and a source wire (ground wire) form a laminated structure with an insulation sheet interposed therebetween so as to decrease the wiring inductance of a gate circuit.

The gate driver circuit component and the power module may be expensive. Hence, when one of the gate driver circuit component or the power module has failed, it is desirable to replace only the faulty one. However, when the gate substrate having the gate driver circuit component mounted thereon and the gate relay substrate fixed to the power module have been fixed to the gate control line, the gate driver circuit component and the power module cannot be readily separated from each other. Thus, even when only one of the gate driver circuit component or the power module has failed, not only the faulty one but also the other one, i.e., the normal one, needs to be replaced, thereby leading to a high repair cost.

SUMMARY OF THE INVENTION

A power conversion apparatus in accordance with an embodiment includes a power module and a gate driver unit. The power module converts input AC power into DC power and outputs the DC power. The gate driver unit includes a first substrate, a second substrate, and a connection member. The first substrate has mounted thereon a gate driver circuit component that isolates a control signal input from a control apparatus, that converts the isolated control signal into a gate signal for driving the power module, and that outputs the gate signal. The second substrate includes a wiring conductor fixed to a gate control terminal of the power module. The connection member includes a connector that connects the first and second substrates to each other.

BRIEF DESCRIPTION OF THE DRAWINGS

FIG. 6 is a perspective view illustrating the power conversion apparatus depicted in FIG. 3 with a capacitor and a bus bar removed therefrom;

FIG. 7 illustrates an example of the arrangement of power modules in a power conversion apparatus in accordance with an embodiment.

DETAILED DESCRIPTION OF EMBODIMENTS

Figure 1:
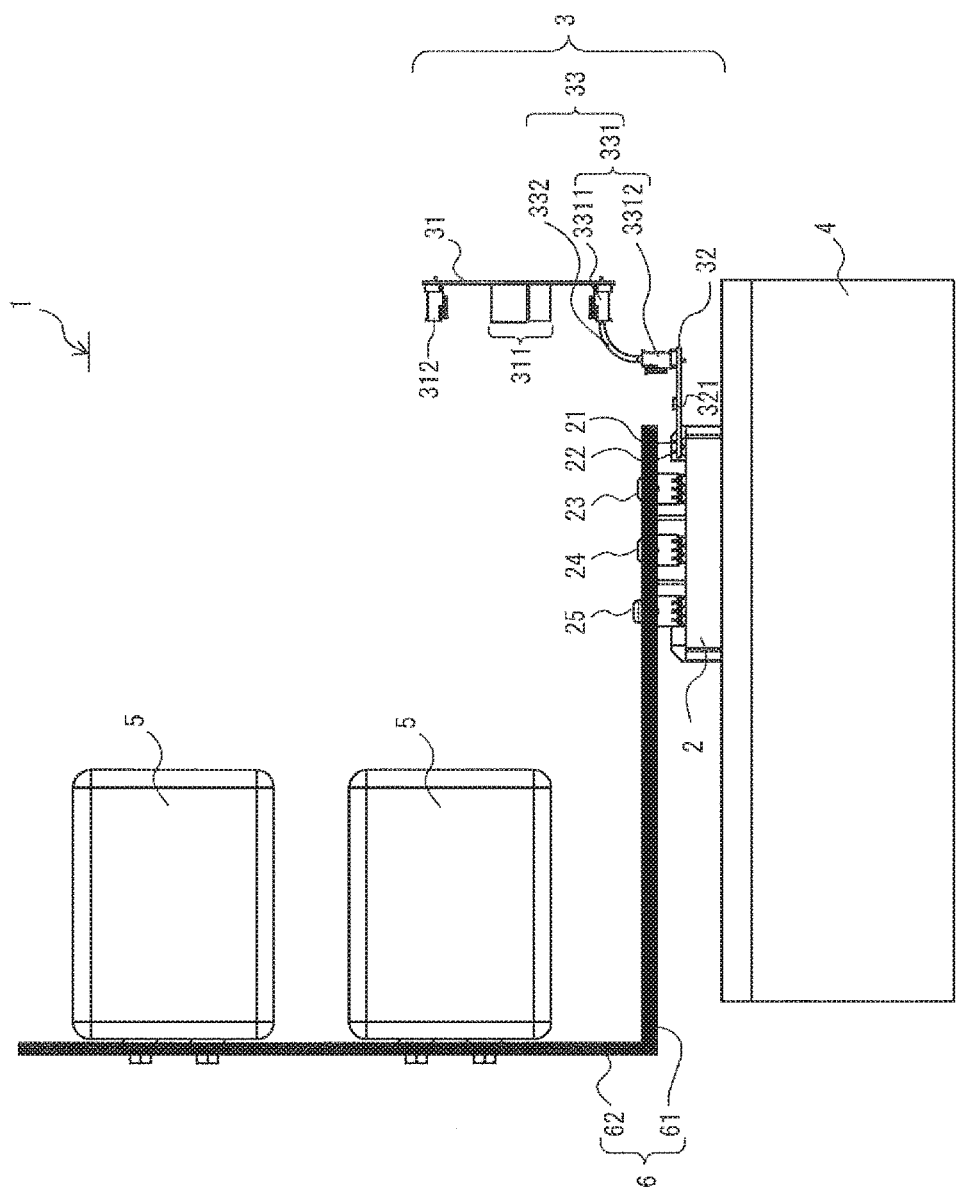
FIG. 1 is a schematic side view illustrating an example of a power conversion apparatus in accordance with an embodiment.
Figure 2:
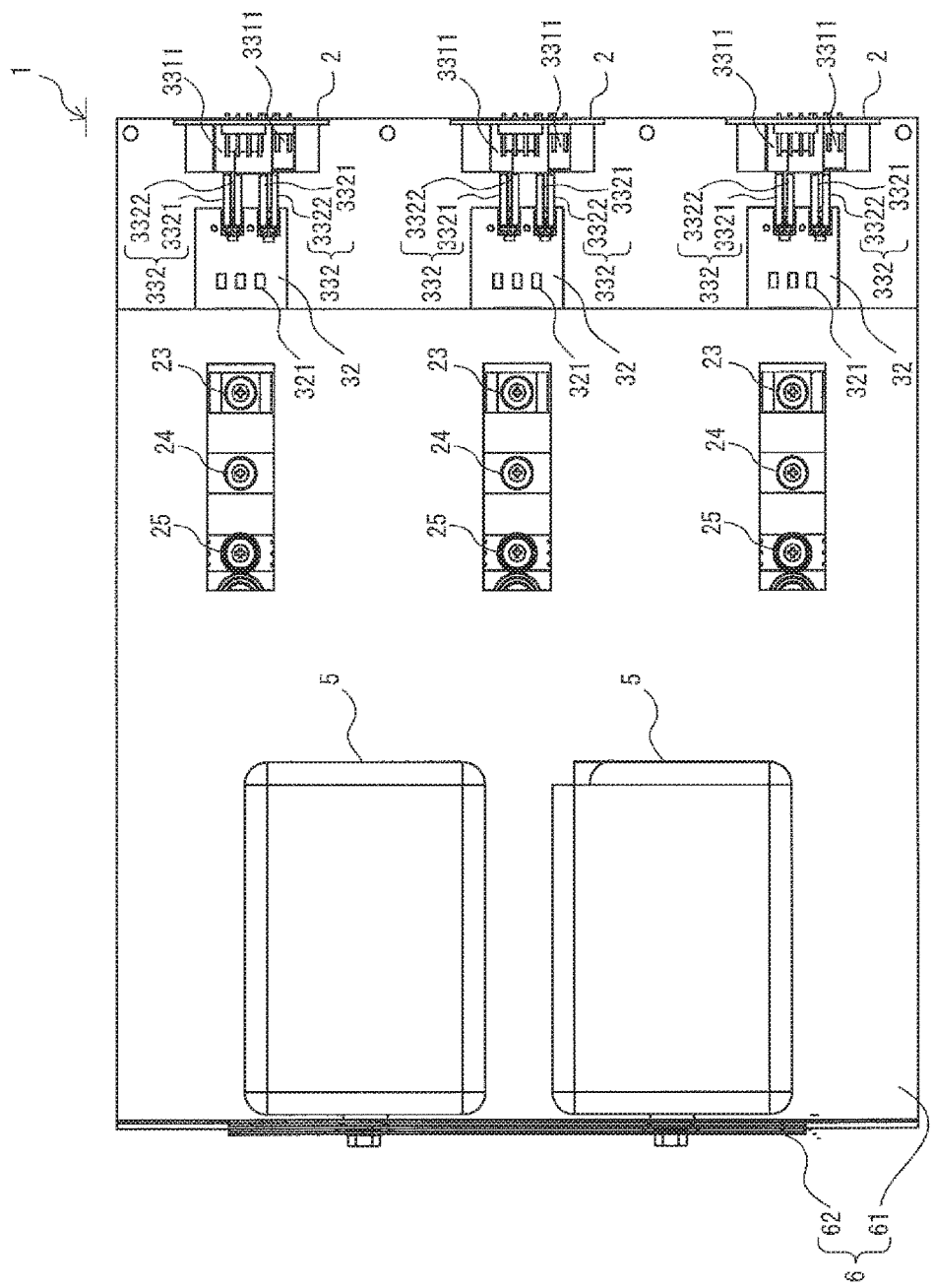
FIG. 2 is a schematic top view illustrating an example of a power conversion apparatus in accordance with an embodiment.
Figure 3:
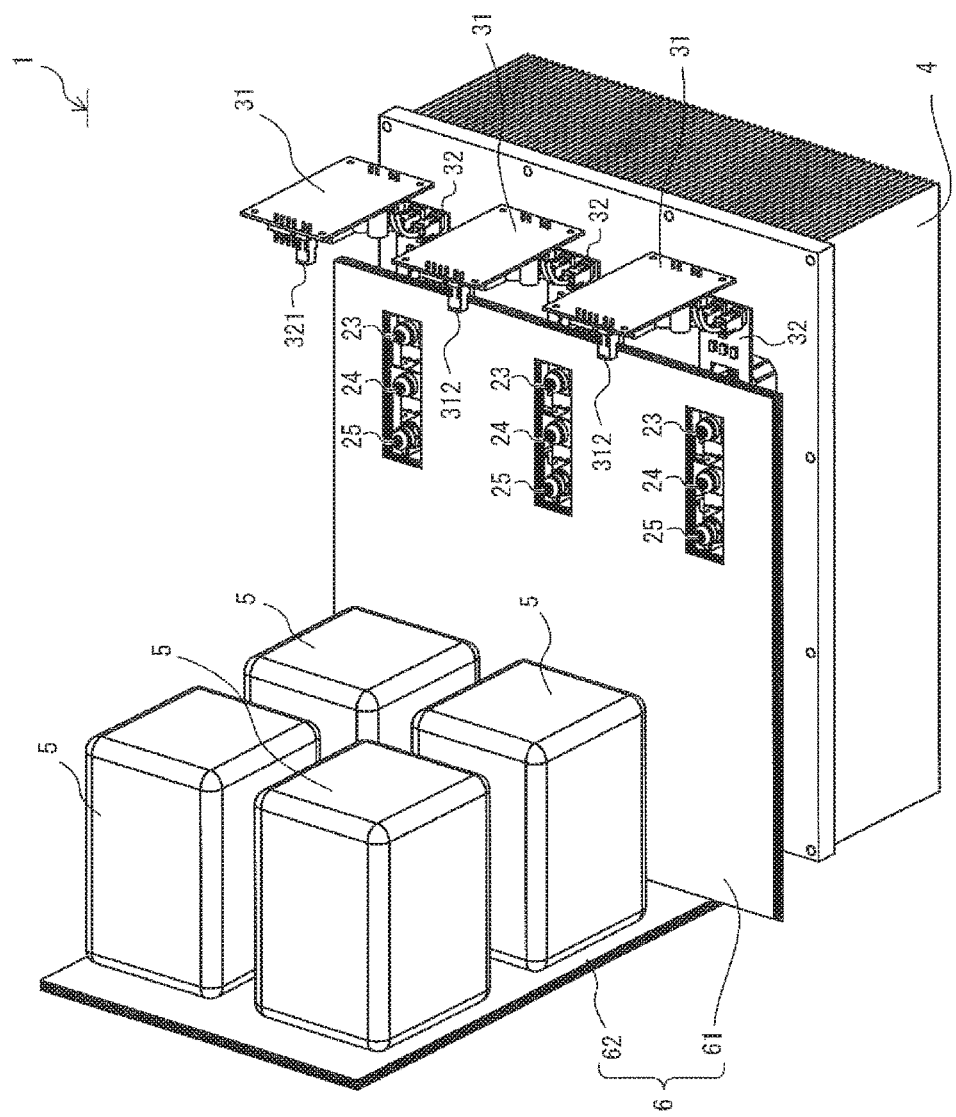
FIG. 3 is a schematic perspective view illustrating an example of a power conversion apparatus in accordance with an embodiment.

The following describes modes for carrying out the present invention by referring to the drawings. FIG. 1 is a schematic side view illustrating an example of a power conversion apparatus in accordance with an embodiment. FIG. 2 is a schematic top view illustrating an example of a power conversion apparatus in accordance with an embodiment. FIG. 3 is a schematic perspective view illustrating an example of a power conversion apparatus in accordance with an embodiment. In the drawings, like reference numerals refer to like parts. In the example depicted in FIGS. 1-3, a power conversion apparatus 1 includes power modules 2, gate driver units 3, a cooler 4, and capacitors 5.

The power module 2 converts input AC power into DC power and outputs the DC power. The power module 2 may include a switching element and a freewheeling diode connected in inverse-parallel to the switching element. The switching element included in the power module 2 may be a wide bandgap semiconductor, e.g., a SiC-MOSFET. The freewheeling diode included in the power module 2 may be, for example, a SiC Schottky barrier diode.

In the exemplary configuration depicted in FIGS. 1-3, three power modules 2 each convert a corresponding one of the three phases of AC power into DC power and each output the resultant DC power. Each power module 2 may be a 2-in-1 power module having a set corresponding to an upper arm and a set corresponding to a lower arm connected in series to each other, each set comprising a switching element and a freewheeling diode.

The power module 2 is disposed on the cooler 4, and a bottom surface of the power module 2 faces a top surface of the cooler 4. A gate control terminal 21, a source control terminal 22, a high-potential main terminal 23, a ground main terminal 24, and an output terminal 25 are disposed on a top surface of the power module 2. For example, the gate control terminal 21 may be a control terminal connected to a gate of each switching element, and the source control terminal 22 may be a control terminal connected to a source of each switching element. The high-potential main terminal 23 is a main terminal connected to a drain of a switching element of the upper arm, and the ground main terminal 24 is a main terminal connected to a source of a switching element of the lower arm. The output terminal 25 is a main terminal connected to the source of the switching element of the upper arm and to the drain of the switching element of the lower arm.

The high-potential main terminal 23 and the ground main terminal 24 are connected to the capacitor 5 via a bus bar 6. As depicted in FIGS. 1-3, the bus bar 6 may include a first surface 61 and a second surface 62. The first surface 61 may be parallel to the top surface of the power module 2. The high-potential main terminal 23 and the ground main terminal 24 are each connected to a corresponding wiring conductor within the first surface 61. The second surface 62 may be located at a position higher than the power module 2 and may be perpendicular to the top surface of the power module 2. Each terminal of the capacitor 5 is connected to a corresponding wiring conductor within the second surface 62.

The capacitor 5 is a smoothing capacitor that attenuates a ripple current generated due to a switching operation of a switching element. Although FIGS. 1-3 depict four capacitors 5, the power conversion apparatus in accordance with the embodiment may include an arbitrary number of capacitors.

The gate driver unit 3 includes a first substrate 31, a second substrate 32, and a connection member 33.

The first substrate 31 corresponds to a gate substrate and has a gate driver circuit component 311 mounted thereon. The gate driver circuit component 311 isolates a control signal input from a control circuit (not illustrated) connected via a connection terminal 312, converts the isolated control signal into a gate signal for driving the power module 2, and outputs the resultant signal. The control signal input from the control circuit may be a PWM (Pulse Width Modulation) signal.

The second substrate 32 is disposed on the power module 2 so as to cover a portion of the top surface of the power module 2. The second substrate 32 corresponds to the gate relay substrate. The gate control terminal 21 and the source control terminal 22 are each connected to a corresponding wiring conductor within the second substrate 32 by soldering or the like. The second substrate 32 may have a gate resistor 321 mounted thereon. The second substrate 32 having the gate resistor 321 mounted thereon allows the gate resistor 321 to be located close to a switching element included in the power module 2. Hence, the gate resistor can be effectively operated even when the switching element is fast switched using a wide bandgap semiconductor.

Figure 4:
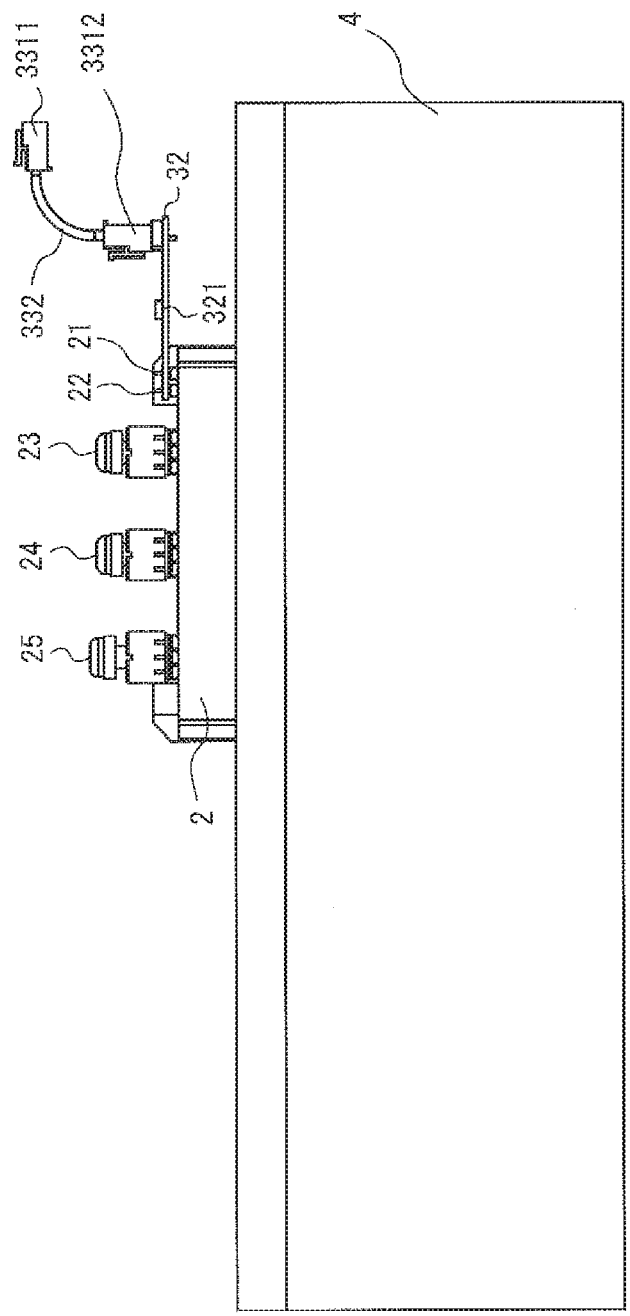
FIG. 4 is a side view illustrating the power conversion apparatus depicted in FIG. 1 with a capacitor and a bus bar removed therefrom.
Figure 5:
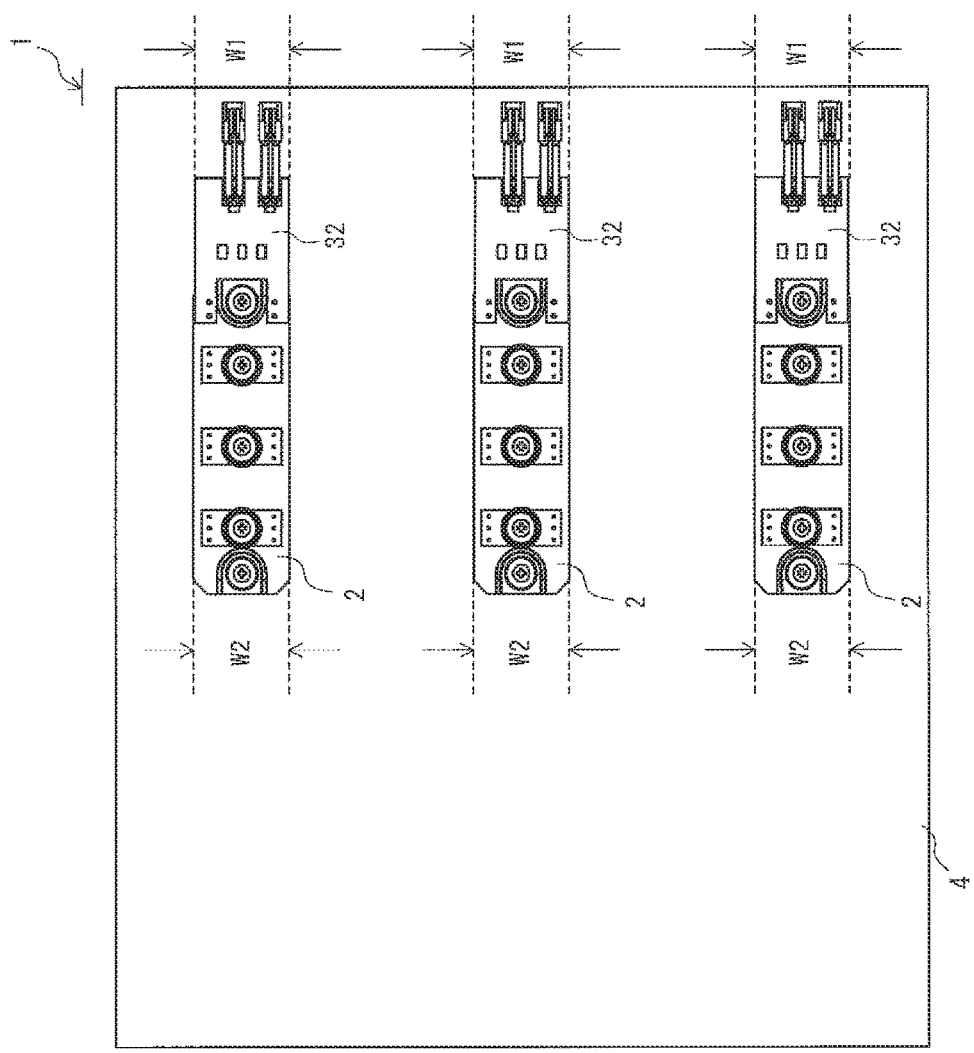
FIG. 5 is a top view illustrating the power conversion apparatus depicted in FIG. 2 with a capacitor and a bus bar removed therefrom.

When a plurality of power modules 2 are arranged in parallel as depicted in FIGS. 4-6, W1 may be equal to or less than W2, where W1 represents the parallel-direction width of each of a plurality of second substrates 32 arranged in parallel in association with the plurality of power modules 2, and W2 represents the parallel-direction width of an associated power module 2. FIG. 4 is a side view illustrating the power conversion apparatus depicted in FIG. 1 with the capacitor and the bus bar removed therefrom. FIG. 5 is a top view illustrating the power conversion apparatus depicted in FIG. 2 with the capacitor and the bus bar removed therefrom. FIG. 6 is a perspective view illustrating the power conversion apparatus depicted in FIG. 3 with the capacitor and the bus bar removed therefrom. The second substrates 32 having the size as described above allows an area on which are mounted the plurality of parallely arranged power modules 2 to be suppressed. When, for example, two power module groups each including the three power modules 2 depicted in FIGS. 1-5 are mounted on the power conversion apparatus 1, as illustrated in FIG. 7, an area on which are mounted six parallely arranged power modules 2 can be suppressed. FIG. 7 illustrates an example of the arrangement of power modules in the power conversion apparatus in accordance with an embodiment.

The connection member 33 includes a connector 331 that connects the first substrate 31 and the second substrate 32.

As described above, a well-known gate control line between the first substrate 31 and the second substrate 32 is, for example, a wiring conductor plate wherein a gate wire and a source wire (ground wire) form a laminated structure with an insulation sheet interposed therebetween so as to decrease the wiring inductance. Connecting a connector to such a wiring conductor plate and then connecting the wiring conductor plate to the first substrate 31 and the second substrate 32 via the connector would less effectively decrease the wiring inductance. Hence, it would be desirable to connect the wiring conductor plate directly to terminals (pins) of the first substrate 31 and the second substrate 32 by soldering or the like. However, if the wiring conductor plate is fixed to terminals of the first substrate 31 and the second substrate 32 by soldering or the like, the first substrate 31 having the gate driver circuit component 311 mounted thereon and the power module 2 having the second substrate 32 fixed thereto would not be readily separated from each other after the first substrate 31 and the power module 2 have been implemented on the power conversion apparatus 1.

By contrast, in the power conversion apparatus 1, the first substrate 31 having the gate driver circuit component 311 mounted thereon and the second substrate 32 fixed to the power module 2 are connected to each other using the connector 331 included in the connection member 33. Hence, in the power conversion apparatus in accordance with the embodiment, the first substrate 31 having the gate driver circuit component 311 mounted thereon and the power module 2 having the second substrate 32 fixed thereto can be readily separated from each other after the first substrate 31 and the power module 2 have been implemented on the power conversion apparatus. The connection member 33 that includes the connector 331 also has the advantage that the connection member 33 can be manufactured at a lower cost than in the case of a wring conductor plate that has a laminated structure such as the one described above.

The connector 331 may include a first connector 3311 on the first-substrate-31 side and a second connector 3312 on the second-substrate-32 side. The connection member 33 may include a gate control line 332 that has one end connected to the first connector 3311 and another end connected to the second connector 3312. The gate control line 332 includes a gate wire 3321 and a source wire 3322. The gate wire 3321 and the source wire 3322 may be cables that include a lead of, for example, copper and an insulation film.

One end of the first connector 3311 is connected to one end of the gate control line 332, and another end of the first connector 3311 is connected to a wiring conductor within the first substrate 31. One end of the second connector 3312 is connected to another end of the gate control line 332, and another end of the second connector 3312 is connected to a wiring conductor within the second substrate 32.

To decrease the inductance of the gate control line 332, the power conversion apparatus 1 may be configured as follows.

The gate control line 332 may be a stranded wire or a twisted wire of the gate wire 3321 and the source wire 3322 between the first connector 3311 and the second connector 3312. In a case where the gate wire 3321 and the source wire 3322 included in the gate control line 332 are formed as a stranded wire, respective magnetic fields generated by currents flowing through the gate wire 3321 and the source wire 3322 cancel each other. This decreases the inductance of the gate control line 332.

As depicted in FIGS. 1-3, a flat surface of the first substrate 31 may be located at a position higher than the second substrate 32 and may be perpendicular to a flat surface (top surface) of the second substrate 32. Arranging the first substrate 31 relative to the second substrate 32 in this way allows the gate control line 332 to become short in comparison with a situation in which the flat surface of the first substrate 31 is parallel to the flat surface of the second substrate 32. This decreases the inductance of the gate control line 332. For example, in the case of the power conversion apparatus 1, the inductance of main circuit wiring such as the bus bar 6 may desirably be 50 [nH] or lower, and the inductance of the gate control line 332 may desirably be 3 [nH] or lower. Making the flat surface of the first substrate 31 perpendicular to the flat surfaced of the second substrate 32 at a position higher than the second substrate 32 allows the gate control line 332 to have a length of 30 [mm] or less. Limiting the length of the gate control line 332 to 30 [mm] or less allows the inductance of the gate control line to decrease to 3 [nH] or lower.

The present invention is not limited to the embodiments described above, and various modifications and changes can be made without departing from the spirit of the invention.

Figure 8:
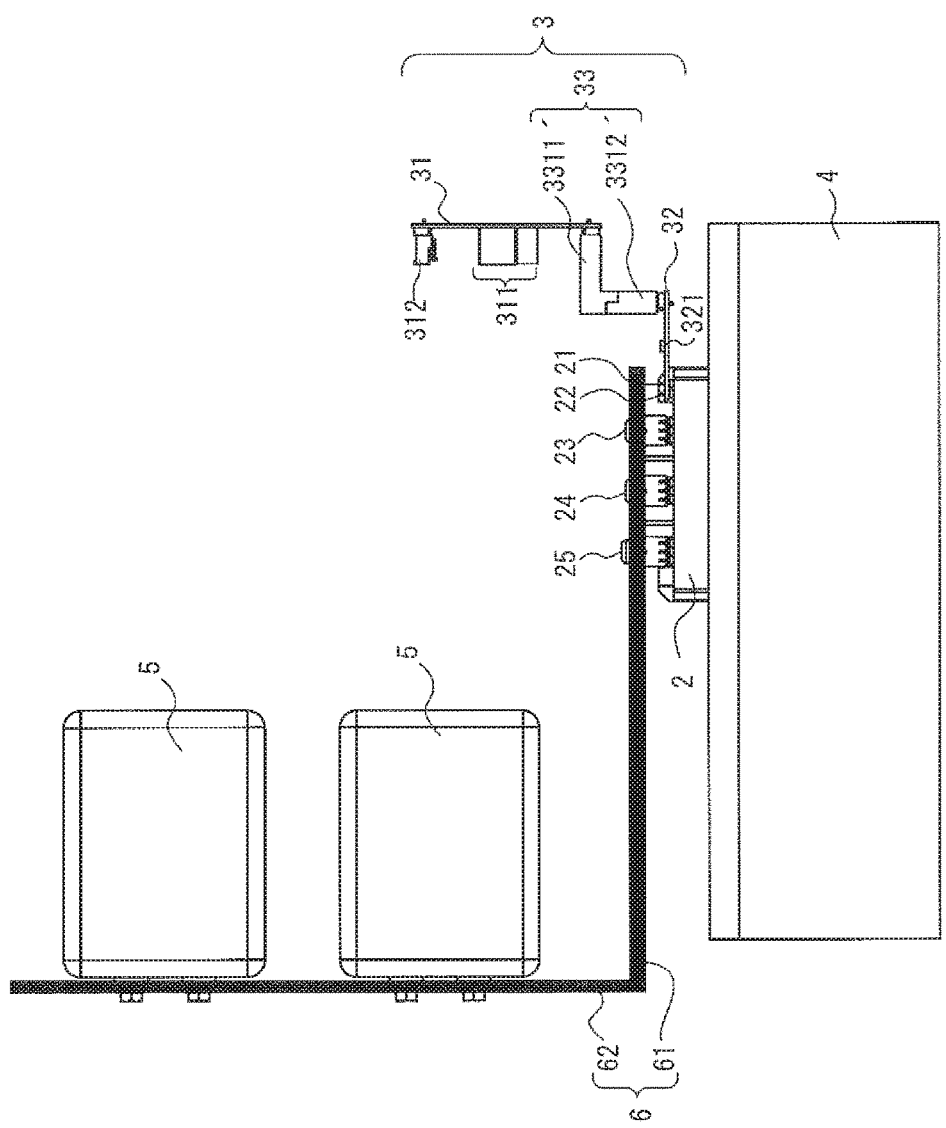
FIG. 8 illustrates another example of a connection member of a power conversion apparatus in accordance with an embodiment.

For example, the gate control line 332 may be omitted from the connection member 33. That is, as depicted in FIG. 8, the connection member 33 may be configured in a manner such that a first connector 3311' and a second connector 3312' are directly interconnected. FIG. 8 illustrates another example of a connection member of a power conversion apparatus in accordance with an embodiment. According to such a configuration, for a power conversion apparatus that includes a gate substrate having a gate driver circuit component mounted thereon and a power module having a gate relay substrate fixed thereto, the gate substrate and the power module can also be readily separated from each other after they have been implemented on the power conversion apparatus.

What is claimed is:

1. A power conversion apparatus comprising:
   a power module that converts an input of alternating current (AC) power into direct current (DC) power and outputs the DC power, the power module having a gate control terminal; and
   a gate driver unit that includes
      a first substrate having mounted thereon a gate driver circuit component that
         isolates a control signal input from a control apparatus,
         converts the isolated control signal into a gate signal for driving the power module, and
         outputs the gate signal,
      a second substrate that includes a wiring conductor fixed to the gate control terminal of the power module, and
      a connection member that includes a connector that connects the first and second substrates to each other, the second substrate receiving the gate signal from the first substrate through the connection member.

2. The power conversion apparatus according to claim 1, wherein
   the connector includes a first connector provided on a first substrate and a second connector provided on a second substrate, and
   the connection member further includes a gate control line connecting the first connector and the second connector.

3. The power conversion apparatus according to claim 2, wherein the gate control line includes a gate wire and a source wire that are twisted to each other.

4. The power conversion apparatus according to claim 1, wherein the second substrate includes a gate resistor mounted thereon.

5. The power conversion apparatus according to claim 1, wherein the power module includes a silicon carbide (SiC) Metal-Oxide-Semiconductor Field-Effect Transistor and a SiC Schottky barrier diode.

6. The power conversion apparatus according to claim 1, wherein
   a width of the second substrate is equal to or less than a width of the power module.

7. The power conversion apparatus according to claim 1, wherein
   the connection member includes a first connector and a second connector provided on a surface of the first substrate and a surface of the second substrate, respectively, and
   the surface of the first substrate is perpendicular to the surface of the second substrate.

8. The power conversion apparatus according to claim 1, wherein the first substrate is located a position higher than a position of the second substrate in relationship to a position of the power module.

9. The power conversion apparatus according to claim 1, wherein the first substrate is disconnectable from the second substrate after the first substrate is connected by the connector to the second substrate.

10. A power conversion apparatus comprising:
a plurality of power modules each of which converts an input of alternating current (AC) power into direct current (DC) power and outputs the DC power; and
a plurality of gate driver units that each includes
a first substrate having mounted thereon a gate driver circuit component that
isolates a control signal input from a control apparatus,
converts the isolated control signal into a gate signal for driving the power module, and
outputs the gate signal,
a second substrate that includes a wiring conductor fixed to the gate control terminal of the power module, and
a connection member that includes a connector that connects the first and second substrates to each other, the second substrate receiving the gate signal from the first substrate through the connection member.

11. The power conversion apparatus according to claim 10, wherein the first substrate is disconnectable from the second substrate after the first substrate is connected by the connector to the second substrate in each of the plurality of gate driver units.

* * * * *